US 12,484,261 B2

(12) United States Patent
Park et al.

(10) Patent No.: US 12,484,261 B2
(45) Date of Patent: Nov. 25, 2025

(54) SEMICONDUCTOR DEVICES

(71) Applicant: SAMSUNG ELECTRONICS CO., LTD., Suwon-si (KR)

(72) Inventors: Jinhong Park, Seoul (KR); Jiwan Koo, Suwon-si (KR); Maksim Andreev, Suwon-si (KR); Sahwan Hong, Suwon-si (KR); Seunghwan Seo, Incheon (KR); Juhee Lee, Ansan-si (KR); Bongjin Kuh, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 638 days.

(21) Appl. No.: 17/888,562

(22) Filed: Aug. 16, 2022

(65) Prior Publication Data
US 2023/0290870 A1   Sep. 14, 2023

(30) Foreign Application Priority Data
Mar. 14, 2022   (KR) .................. 10-2022-0031441

(51) Int. Cl.
*H01L 29/76* (2006.01)
*H01L 21/02* (2006.01)
(Continued)

(52) U.S. Cl.
CPC ..... *H10D 48/362* (2025.01); *H01L 21/02568* (2013.01); *H10D 30/6713* (2025.01);
(Continued)

(58) Field of Classification Search
CPC .............. H10D 30/47; H10D 30/6219; H10D 30/6713; H10D 30/6729; H10D 30/6757;
(Continued)

(56) References Cited

U.S. PATENT DOCUMENTS

| 8,941,798 B2 | 1/2015 | Park et al. |
| 9,349,802 B2 | 5/2016 | Heo et al. |

(Continued)

FOREIGN PATENT DOCUMENTS

| KR | 10-2016-0120057 A | 10/2016 |
| KR | 10-2080488 | 2/2020 |

(Continued)

OTHER PUBLICATIONS

Office Action dated August 10. 2025 issued in Korean Patent Application No. KR 10-2022-0031441.
(Continued)

*Primary Examiner* — David C Spalla
(74) *Attorney, Agent, or Firm* — MORGAN, LEWIS & BOCKIUS LLP

(57) ABSTRACT

A semiconductor device includes a channel on a substrate. The channel includes a 2-dimensional material. A gate insulating layer is on a first portion of the channel. A gate electrode is on a portion of the gate insulating layer. First and second contact patterns are on second portions of the channel, respectively. Each of the first and second contact patterns includes a 2-dimensional material having an intercalation material disposed therein. First and second source/drain electrodes are on the first and second contact patterns, respectively. Each of the first and second source/drain electrodes includes a metal.

19 Claims, 9 Drawing Sheets

(51) Int. Cl.
*H01L 29/24* (2006.01)
*H01L 29/417* (2006.01)
*H01L 29/66* (2006.01)
*H01L 29/786* (2006.01)
*H10D 30/67* (2025.01)
*H10D 48/36* (2025.01)
*H10D 62/80* (2025.01)
*H10D 99/00* (2025.01)

(52) U.S. Cl.
CPC ..... *H10D 30/6729* (2025.01); *H10D 30/6757* (2025.01); *H10D 62/80* (2025.01); *H10D 99/00* (2025.01)

(58) Field of Classification Search
CPC .. H10D 30/797; H10D 48/362; H10D 62/021; H10D 62/149; H10D 62/151; H10D 62/80; H10D 84/013; H10D 84/017; H10D 99/00; H01L 21/02568
See application file for complete search history.

(56) References Cited

U.S. PATENT DOCUMENTS

| | | |
|---|---|---|
| 9,595,580 B2 | 3/2017 | Shin et al. |
| 9,608,101 B2 | 3/2017 | Kis et al. |
| 10,269,975 B2 | 4/2019 | Park et al. |
| 10,529,877 B2 | 1/2020 | Heo et al. |
| 10,985,019 B2 | 4/2021 | Lin et al. |
| 2017/0012117 A1* | 1/2017 | Radosavljevic ..... H10D 86/423 |
| 2020/0006541 A1 | 1/2020 | Lin et al. |
| 2021/0184020 A1* | 6/2021 | Su ................. H10D 30/478 |
| 2021/0202265 A1 | 7/2021 | Chuu et al. |
| 2021/0305378 A1 | 9/2021 | Seol et al. |
| 2021/0359099 A1 | 11/2021 | Shen et al. |
| 2023/0282739 A1* | 9/2023 | Ho ................... H10D 48/362 257/29 |

FOREIGN PATENT DOCUMENTS

| | | |
|---|---|---|
| KR | 10-2140148 | 7/2020 |
| KR | 10-2144999 | 8/2020 |

OTHER PUBLICATIONS

Zhang, P., et al., "Contact engineering for two-dimensional semiconductors", Journal of Semiconductors, 41, 071901, Jul. 2020, pp. 1-15.

Shin, Y.S., et al., "Li Intercalation Effects on Interface Resistances of High-Speed and Low-Power WSe2 Field-Effect Transistors", Advanced Functional Materials, 30, 2003688, Sep. 9, 2020, pp. 1-9.

* cited by examiner

SEMICONDUCTOR DEVICES

CROSS-REFERENCE TO RELATED APPLICATION

This application claims priority under 35 USC § 119 to Korean Patent Application No. 10-2022-0031441, filed on Mar. 14, 2022 in the Korean Intellectual Property, the disclosure of which is incorporated by reference in its entirety herein.

TECHNICAL FIELD

Example embodiments relate to a semiconductor device. More particularly, example embodiments relate to a transistor.

DISCUSSION OF RELATED ART

A channel including silicon is generally used in a semiconductor device. However, as semiconductor devices have become increasingly smaller, the electrical characteristic of the channel including silicon reaches a limit. Accordingly, a channel including a 2-dimensional material having a higher charge mobility than silicon has been developed. However, the 2-dimensional material has a high contact resistance with other structures.

SUMMARY

Example embodiments provide a semiconductor device having increased electrical characteristics.

According to an embodiments of the present disclosure, a semiconductor device includes a channel on a substrate. The channel includes a 2-dimensional material. A gate insulating layer is on a first portion of the channel. A gate electrode is on a portion of the gate insulating layer. First and second contact patterns are on second portions of the channel, respectively. Each of the first and second contact patterns includes a 2-dimensional material having an intercalation material disposed therein. First and second source/drain electrodes are on the first and second contact patterns, respectively. Each of the first and second source/drain electrodes includes a metal.

According to an embodiment of the present disclosure, a semiconductor device includes a channel on a substrate. The channel includes a transition metal dichalcogenide (TMD) containing a transition metal and a chalcogen element. A gate insulating layer is on a first portion of the channel. A gate electrode is on a first portion of the gate insulating layer. First and second contact patterns are on second portions of the channel, respectively. First and second source/drain electrodes are on the first and second contact patterns, respectively. Each of the first and second source/drain electrodes includes a metal. Each of the first and second contact patterns has a multi-layered structure including single layers stacked in a vertical direction substantially perpendicular to an upper surface of the substrate. Each of the single layers including a transition metal dichalcogenide (TMD), and an intercalation material disposed between the single layers.

According to an embodiment of the present disclosure, a semiconductor device includes an insulating layer on a substrate. A channel is on the insulating layer. The channel includes a 2-dimensional material. First and second contact patterns are on upper edge surfaces, respectively, of the channel. Each of the first and second contact patterns includes a 2-dimensional material having an intercalation material disposed therein. First and second source/drain electrodes are on the first and second contact patterns, respectively. Each of the first and second source/drain electrodes includes a metal. A gate insulating layer is on an upper central surface and sidewalls of the channel, sidewalls of the first and second contact patterns, and sidewalls and upper surfaces of the first and second source/drain electrodes. A gate electrode is on the gate insulating layer on the upper central surface of the channel. A lower surface and a sidewall of the gate electrode are covered by the gate insulating layer. A first contact plug directly contacts an upper surface of the gate electrode. Second and third contact plugs extend through the gate insulating layer and directly contact upper surfaces of the first and second source/drain electrodes, respectively.

In example embodiments, the semiconductor device may include the channel including the 2-dimensional material with a high charge mobility, and the first and second contact patterns, which may include the 2-dimensional material having the intercalation material inserted therein so as to decrease the contact resistance between the channel and the first and second source/drain electrodes, respectively. Accordingly, the semiconductor device may have increased electrical characteristics.

DETAILED DESCRIPTION OF EMBODIMENTS

Example embodiments will be described in detail with reference to the accompanying drawings.

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Figure 1:
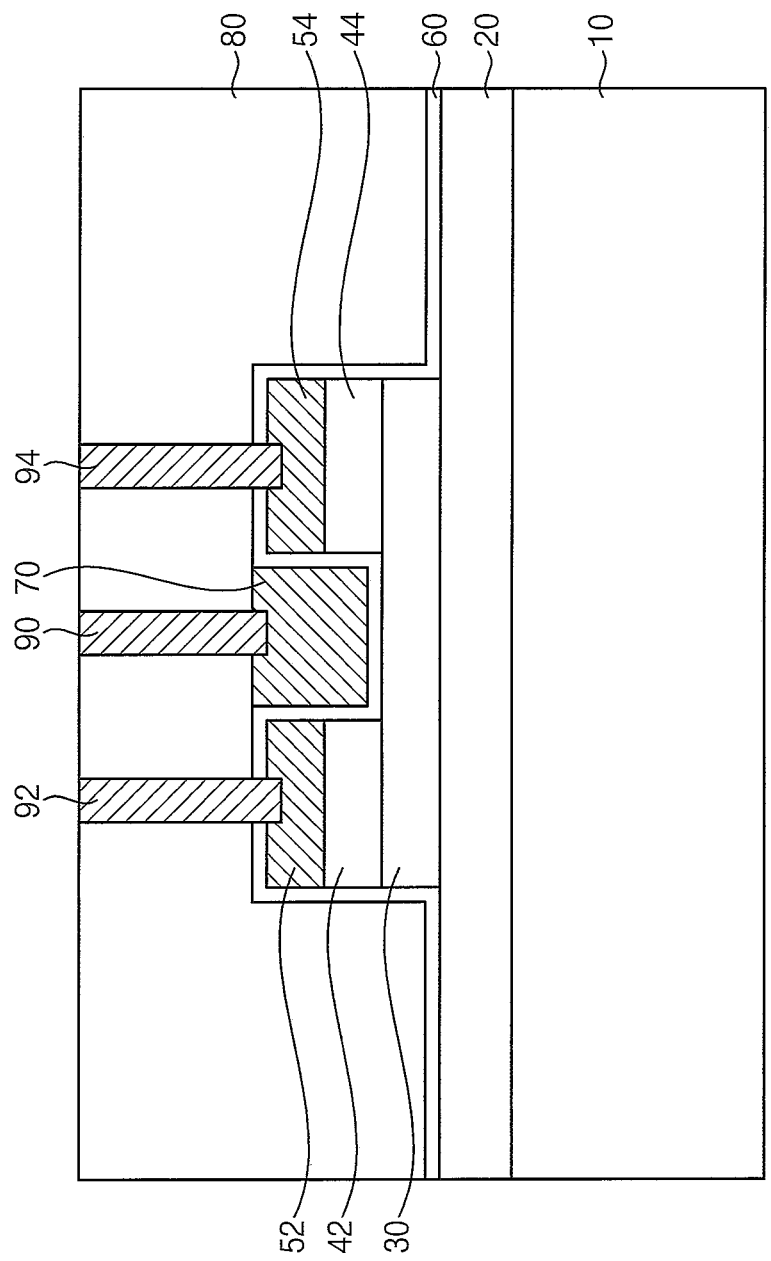
FIG. 1 is a cross-sectional view illustrating a semiconductor device in accordance with an embodiment of the present disclosure.

FIG. 1 is a cross-sectional view illustrating a semiconductor device in accordance with an embodiment of the present disclosure.

Referring to FIG. 1, the semiconductor device may include an insulating layer 20 on a first substrate 10, a channel 30, first and second contact patterns 42 and 44, first and second source/drain electrodes 52 and 54, a gate insulating layer 60, a gate electrode 70, an insulating interlayer 80, and first to third contact plugs 90, 92, and 94, and the gate electrode 70, the gate insulating layer 60, the channel 30, the first and second contact patterns 42 and 44, and the first and second source/drain electrodes 52 and 54 may form a transistor.

In an embodiment, the first substrate 10 may include, for example, a semiconductor material such as silicon, germanium, or silicon-germanium. The insulating layer 20 may include, for example, an insulating material such as an oxide or a nitride. However, embodiments of the present disclosure are not necessarily limited thereto. For example, in an embodiment the semiconductor device may include only an insulating substrate including an insulating material without the first substrate 10.

The channel 30 may be disposed on the insulating layer 20. In an embodiment, the channel 30 may include a 2-dimensional material, and the channel 30 may include a single layer containing atoms having a 2-dimensional crystal structure, or may have a multi-layered structure in which a plurality of single layers is stacked in a vertical direction substantially perpendicular to an upper surface of the first substrate 10.

In an embodiment, the 2-dimensional material may include a transition metal dichalcogenide (TMD) containing a transition metal and a chalcogen element, and may be represented by a chemical formula $MX_2$ (M: transition metal, X: chalcogen element). In an embodiment, the transition metal may include, for example, at least one element selected from molybdenum (Mo), tungsten (W), renium (Re), niobium (Nb), vanadium (V), tantalum (Ta), titanium (Ti), zirconium (Zr), hafnium (Hf), technetium (Tc), and the like, and the calcogen element may include, for example, at least one element selected from sulfur (S), selenium (Se), tellurium (Te), and the like. The transition metal dichalcogenide (TMD) may include, for example, molybdenum sulfide ($MoS_2$), tungsten sulfide ($WS_2$), molybdenum diselenide ($MoSe_2$), tungsten diselenide ($WSe_2$), or the like.

The first and second contact patterns 42 and 44 may be disposed on upper edge surfaces, respectively, of the channel 30. For example, the first and second contact patterns 42, 44 may be disposed on lateral edges of the upper surface of the channel 30.

In an embodiment, each of the first and second contact patterns 42 and 44 may include a 2-dimensional material having an intercalation material inserted therein (e.g., disposed therein). The 2-dimensional material included in the first and second contact patterns 42 and 44 may be substantially the same as or different from the 2-dimensional material included in the channel 30. In an embodiment, each of the first and second contact patterns 42 and 44 may have a multi-layered structure in which single layers are stacked in the vertical direction. Each of the single layers may include the 2-dimensional material and the intercalation material may be inserted between the single layers. For example, the intercalation material may be disposed between adjacent single layers of the 2-dimensional material.

The first and second source/drain electrodes 52 and 54 may be disposed on the first and second contact patterns 42 and 44, respectively. In an embodiment, each of the first and second source/drain electrodes 52 and 54 may include, for example, a metal, a metal nitride, or a metal silicide.

The gate insulating layer 60 may be formed on a portion of the channel 30. For example, in an embodiment the gate insulating layer 60 may be formed on an upper central surface of the channel 30 not covered by the first and second contact patterns 42 and 44 and sidewalls of the channel 30. The gate insulating layer 60 may also be formed on sidewalls of the first and second contact patterns 42 and 44, sidewalls and upper surfaces of the first and second source/drain electrodes 52 and 54, and an upper surface of the insulating layer 20. In an embodiment, the gate insulating layer 60 may include, for example, silicon oxide, a metal oxide, or the like.

The gate electrode 70 may be disposed on a portion of the gate insulating layer 60 on the upper central surface of the channel 30, and a lower surface and a sidewall of the gate electrode 70 may be covered by the gate insulating layer 60. In an embodiment, the gate electrode 70 may include, for example, a metal, a metal nitride, a metal silicide, polysilicon doped with impurities, or the like.

The insulating interlayer 80 may be disposed on the insulating layer 20, and may cover the gate insulating layer 60 and the gate electrode 70. In an embodiment, the insulating interlayer 80 may include, for example, an oxide such as silicon oxide, a nitride such as silicon nitride, or a low-dielectric material.

The first contact plug 90 may extend through the insulating interlayer 80 (e.g., in a vertical direction), and may directly contact an upper surface of the gate electrode 70. The second and third contact plugs 92 and 94 may extend through the insulating interlayer 80 (e.g., in a vertical direction) and the gate insulating layer 60, and may directly contact upper surfaces of the first and second source/drain electrodes 52 and 54, respectively. In an embodiment, the first contact plug 90 may extend below an uppermost surface of the gate electrode 70 and the second and third contact plugs 92 and 94 may extend below an uppermost surface of the first and second source/drain electrodes 52 and 54, respectively. In an embodiment, each of the first to third contact plugs 90, 92, and 94 may include, for example, a metal, a metal nitride, a metal silicide, or the like.

The semiconductor device may include the first and second contact patterns 42 and 44 between the channel 30 including a 2-dimensional material and the first and second source/drain electrodes 52 and 54, respectively, including a metal, and each of the first and second contact patterns 42 and 44 may include a 2-dimensional material having an intercalation material inserted therein. Generally, the channel 30 including the 2-dimensional material may have a charge mobility that is higher than a charge mobility of a channel including silicon. However, a contact resistance with each of the first and second source/drain electrodes 52 and 54 including the metal may be relatively high.

In an embodiment, the first and second contacts patterns 42 and 44 may be disposed between the channel 30 and the first and second source/drain electrodes 52 and 54 (e.g., in a vertical direction), respectively, and the first and second contact patterns 42 and 44 may include a 2-dimensional material having an intercalation material inserted therein. Thus, the contact resistance between the channel 30 and each of the first and second source/drain electrodes 52 and 54 may be lowered.

Figure 2:
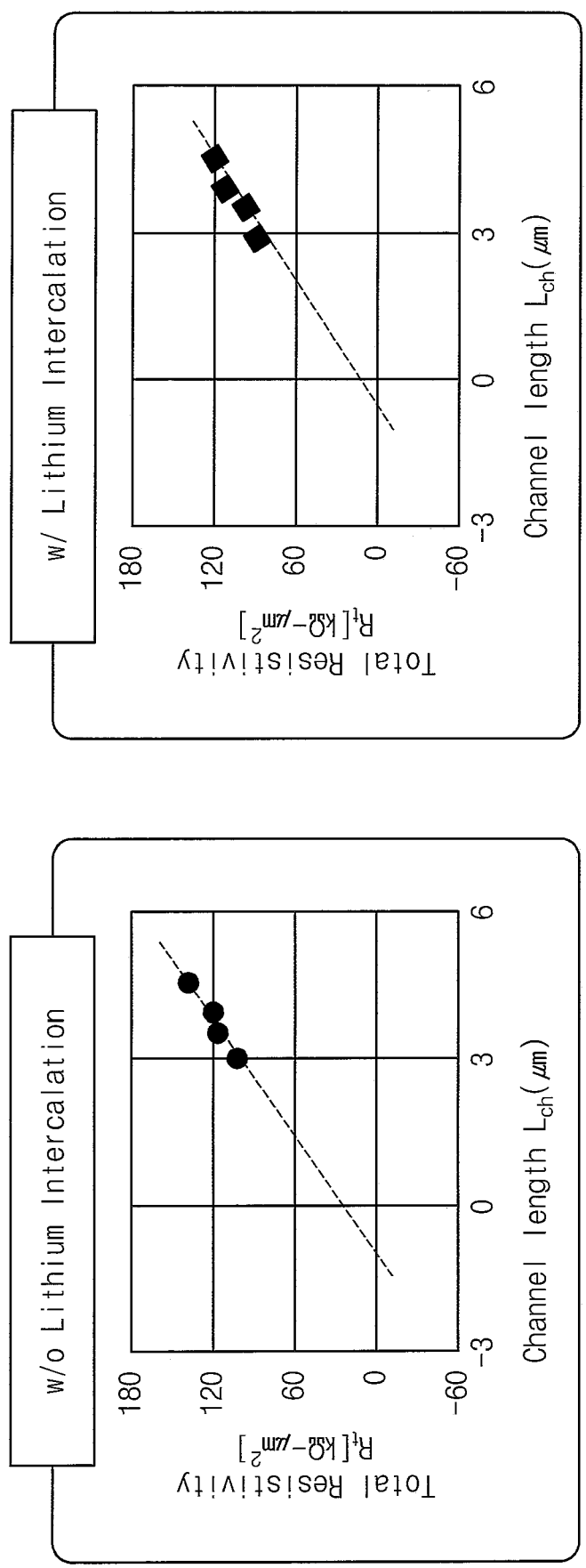
FIG. 2 is a graph illustrating a total resistance of a 2-dimensional material and a total resistance of a 2-dimensional material including lithium (Li) as an intercalation material.
Figure 3:
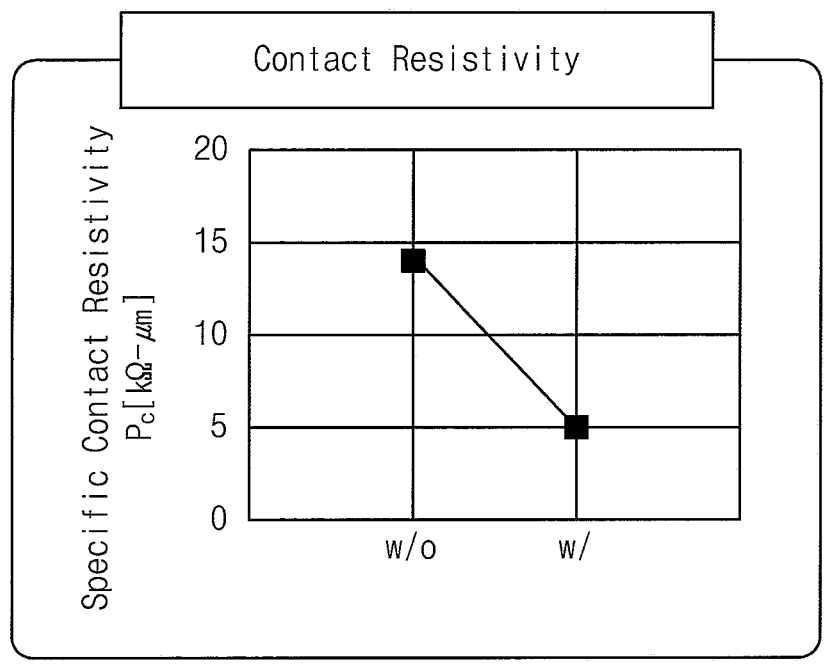
FIG. 3 is a graph illustrating contact resistances of a 2-dimensional material and a 2-dimensional material including lithium (Li) as an intercalation material.

FIG. 2 is a graph illustrating a total resistance of a 2-dimensional material and a total resistance of a 2-dimensional material including lithium (Li) as an intercalation material, and FIG. 3 is a graph illustrating contact resistances thereof.

Referring to FIG. 2, the total resistance of the 2-dimensional material including lithium (Li) as the intercalation material is less than the total resistance of the 2-dimensional material not including the intercalation material.

Accordingly, referring to FIG. 3, the contact resistance of the 2-dimensional material including lithium (Li) as the intercalation material is about ⅓ of the contact resistance of the 2-dimensional material not including the intercalation material.

The semiconductor device may include the channel 30 including a 2-dimensional material with a high charge mobility, and the first and second contact patterns 42 and 44, which may include a 2-dimensional material having an intercalation material inserted therein, between the channel 30 and the first and second source/drain electrodes 52 and 54, respectively, and thus the semiconductor device may have increased electrical characteristics.

Figure 4:
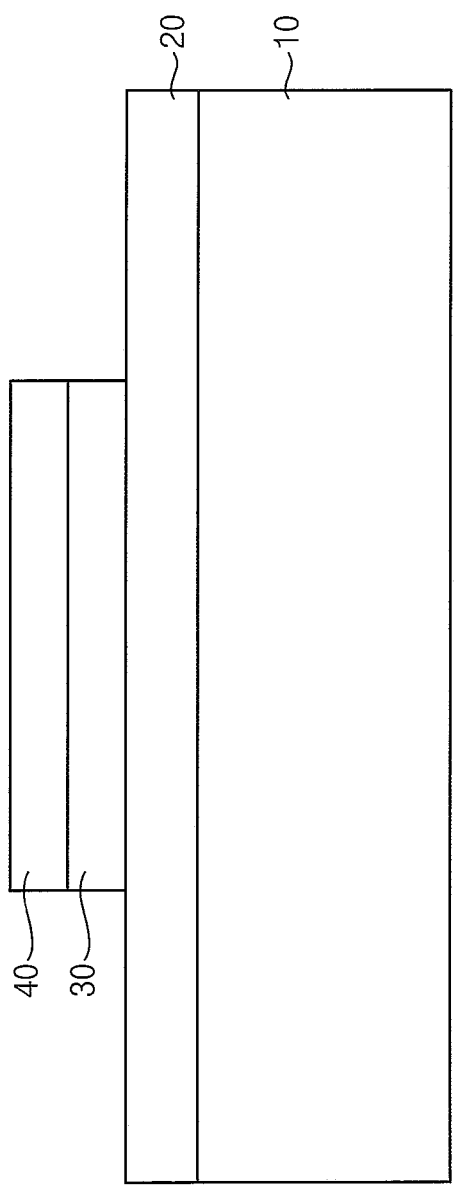
FIGS. 4 to 6 are cross-sectional views illustrating a method of manufacturing a semiconductor device according to embodiments of the present disclosure.
Figure 5:
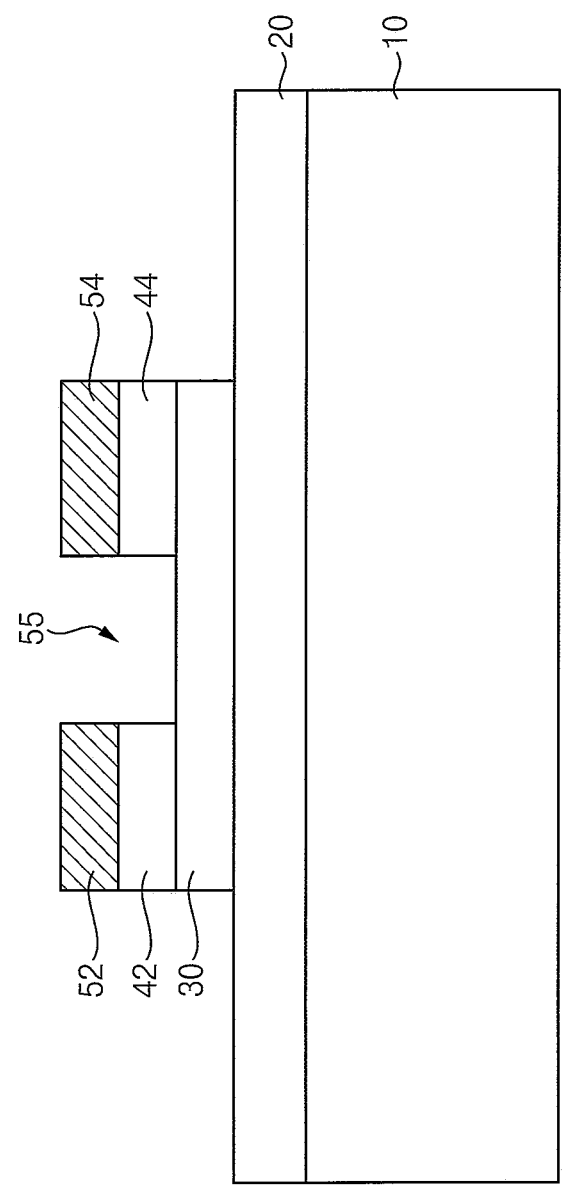
Figure 6:
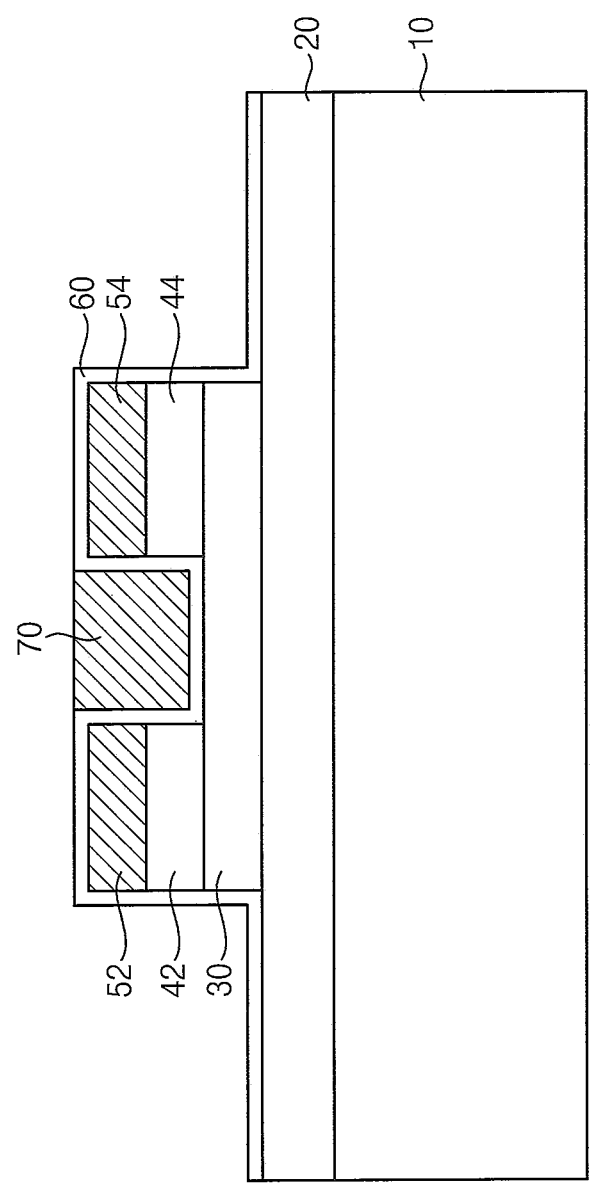

FIGS. 4 to 6 are cross-sectional views illustrating a method of manufacturing a semiconductor device in accordance with embodiments of the present disclosure.

Referring to FIG. 4, the insulating layer 20 may be formed on the first substrate 10, the channel 30 may be formed on the insulating layer 20, and a contact layer 40 may be formed on the channel 30.

In an embodiment, the channel 30 may be formed on the insulating layer 20 by a chemical vapor deposition (CVD) process.

In an embodiment, the contact layer 40 may be formed by forming a preliminary contact layer including a 2-dimensional material on a second substrate and dipping the second substrate on which the preliminary contact layer is formed in a container with a solvent for a predetermined time period, and the contact layer 40 on the second substrate may be transferred to the channel 30 on the first substrate 10.

In an embodiment, the preliminary contact layer may include a 2-dimensional material substantially the same as or different from the 2-dimensional material included in the channel 30. The preliminary contact layer may have a multi-layered structure in which single layers are stacked in a vertical direction substantially perpendicular to an upper surface of the second substrate, and each of the single layers may contain atoms having a 2-dimensional crystal structure.

In an embodiment, the solvent may include, for example, an intercalation material such as lithium (Li), potassium (K), or the like. For example, the solvent may include n-butyl-lithium (n-BuLi), tert-butyllithium (t-BuLi), methyllithium (MeLi), or the like.

The intercalation material included in the solvent may be doped in the preliminary contact layer by dipping the preliminary contact layer in the solvent for the predetermined time period, and the doped intercalation material may be inserted between the single layers included in the preliminary contact layer to form the contact layer 40.

Referring to FIG. 5, a source/drain layer may be formed on the contact layer 40, an etch mask may be formed on the source/drain layer, and the source/drain layer and the contact layer 40 may be etched by an etching process using the etch mask to form an opening 55 exposing an upper surface of the channel 30.

Accordingly, the first and second contact patterns 42 and 44 may be formed on the channel 30, and the first and second source/drain electrodes 52 and 54 may be formed on the first and second contact patterns 42 and 44, respectively.

Referring to FIG. 6, the gate insulating layer 60 may be formed on the upper surface of the insulating layer 20, the sidewalls of the channel 30, the upper surface of the channel 30 exposed by the opening 55, the sidewalls of the first and second contact patterns 42 and 44, and the sidewalls and upper surfaces of the first and second source/drain electrodes 52 and 54. The gate electrode 70 may be formed on the gate insulating layer 60 filling a remaining portion of the opening 55.

Referring to FIG. 1 again, the insulating interlayer 80 may be formed on the insulating layer 20 to cover the gate electrode 70 and the gate insulating layer 60, the first contact plug 90 may be formed through the insulating interlayer 80 to directly contact an upper surface of the gate electrode 70, and the second and third contact plugs 92 and 94 may be formed through the insulating interlayer 80 and the gate insulating layer 60 to directly contact upper surfaces of the first and second source/drain electrodes 52 and 54, respectively.

The manufacturing of the semiconductor device may be completed by the processes described above.

Figure 7:
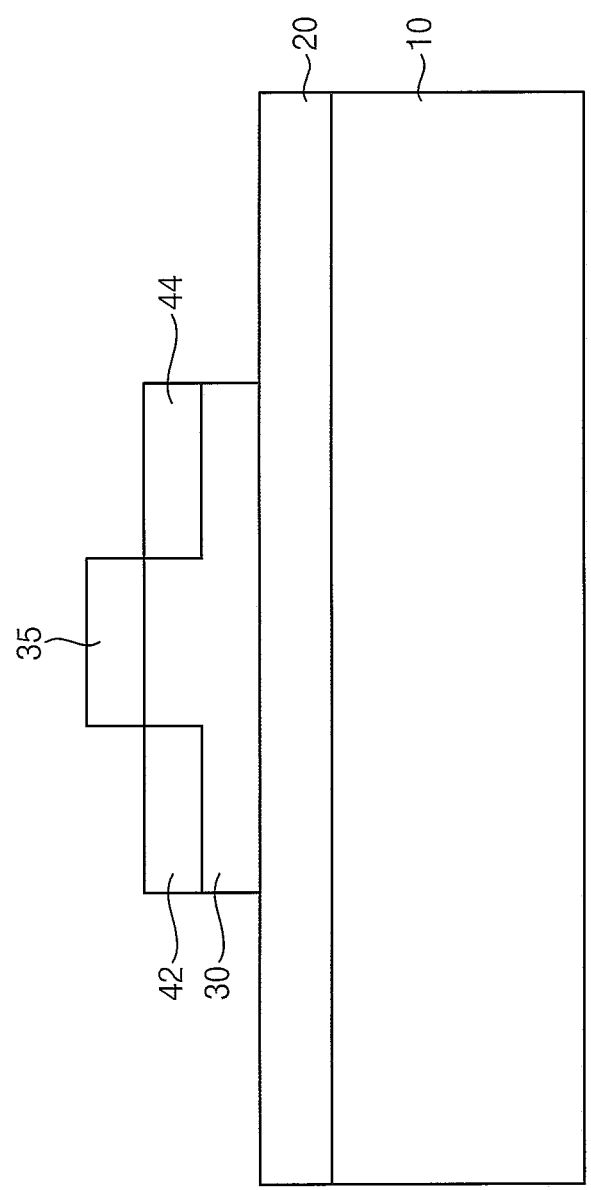
FIGS. 7 and 8 are cross-sectional views illustrating a method of manufacturing a semiconductor device according to embodiments of the present disclosure.
Figure 8:
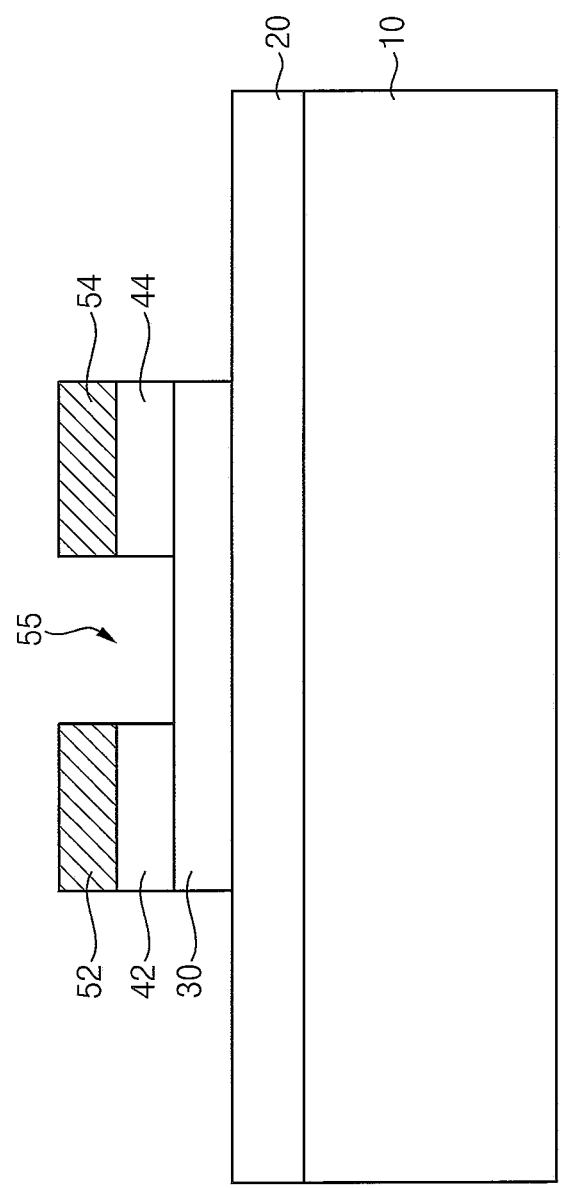

FIGS. 7 and 8 are cross-sectional views illustrating a method of manufacturing a semiconductor device in accordance with embodiments of the present disclosure. This method may include processes substantially the same as or similar to the processes illustrated with reference to FIGS. 4 to 6 and FIG. 1, and repeated explanations thereof are omitted herein for convenience of explanation.

Referring to FIG. 7, processes substantially the same as or similar to the processes illustrated with reference to FIG. 4 may be performed to form the insulating layer 20 and the channel 30 on the first substrate 10.

A mask 35 may be formed on the channel 30. In an embodiment, a spin coating process may be performed to dope an intercalation material into upper portions of the channel 30 so that the first and second contact patterns 42 and 44 may be formed.

In the spin coating process, the solvent illustrated with reference to FIG. 4 may be used, and lithium or potassium atoms included in the solvent may be inserted between the single layers in the channel 30 including the 2-dimensional material.

The mask 35 may then be removed.

Referring to FIG. 8, processes similar to the processes illustrated with reference to FIG. 5 may be performed.

For example, the source/drain layer may be formed on the channel 30 and the first and second contact patterns 42 and 44, the etch mask may be formed on the source/drain layer, and the source/drain layer and an upper portion of the channel 30 between the first and second contact patterns 42 and 44 may be etched by an etching process using the etch mask to form the opening 55 exposing an upper surface of a lower portion of the channel 30.

Accordingly, the first and second contact patterns 42 and 44 may be formed on lower portions, respectively, of the remaining channel 30, and the first and second source/drain electrodes 52 and 54 may be formed on the first and second contact patterns 42 and 44, respectively.

The manufacturing of the semiconductor device may be completed by the processes illustrated with reference to FIGS. 6 and 1.

Figure 9:
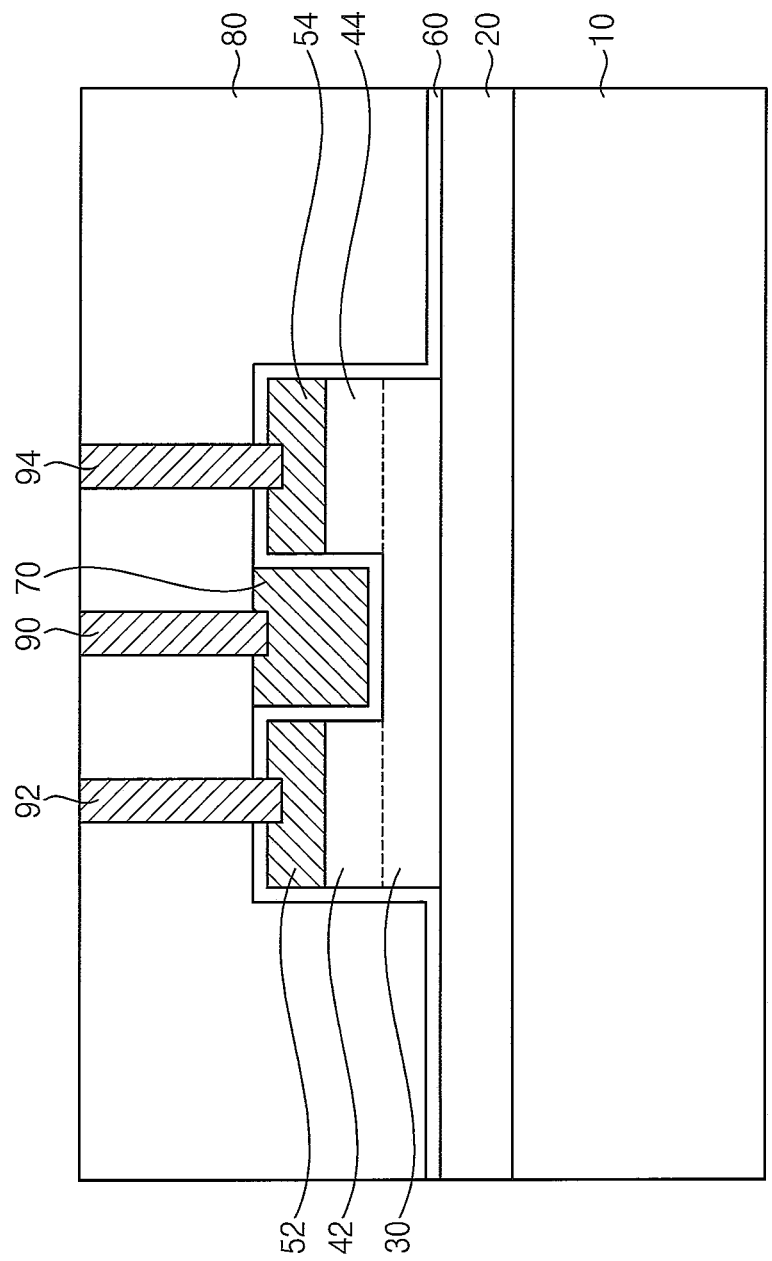
FIG. 9 is a cross-sectional view illustrating a semiconductor device according to an embodiment of the present disclosure.

FIG. 9 is a cross-sectional view illustrating a semiconductor device in accordance with an embodiment of the present inventive concept.

The semiconductor device may be substantially the same as or similar to the semiconductor device illustrated with reference to FIG. 1, except that the channel and contact patterns include substantially the same material. Accordingly, like reference numerals refer to like elements, and repeated explanations thereof are omitted herein for convenience of explanation.

Referring to FIG. 9, the channel 30 and the first and second contact patterns 42 and 44 included in the semiconductor device may include substantially the same material, particularly, the 2-dimensional material having the intercalation material inserted therein. Accordingly the channel 30 and the first and second contact patterns 42 and 44 may be integrally formed.

As the channel 30 includes the 2-dimensional material, the channel 30 may have a charge mobility that is higher than a charge mobility of a channel including silicon. As the first and second contact patterns 42 and 44 are integrally formed with the channel 30 include the 2-dimension material having a intercalation material inserted therein, the first and second contact patterns 42 and 44 may have a contact resistance with the first and second source/drain electrodes 52 and 54 that is less than a contact resistance of first and second contact patterns including only a 2-dimensional material.

The semiconductor device may be formed by dipping the first substrate 10 on which the channel 30 is formed in a solvent for a predetermined time, instead of dipping the second substrate on which the preliminary contact layer is formed, among the processes illustrated with reference to FIG. 4, and thus the intercalation material included in the solvent may be doped into the channel 30 to be inserted between the single layers included in the channel 30. Accordingly, the channel 30 may include substantially the same material as the contact layer 40.

Like the processes illustrated with reference to FIG. 5, the source/drain layer may be formed on the channel 30, the etch mask may be formed on the source/drain layer, and the source/drain layer and the upper portion of the channel 30 may be etched by an etching process using the etch mask to form the opening 55 exposing the upper surface of the lower portion of the channel 30.

Upper portions of the channel 30 remaining on the lower portion of the channel 30 may be referred to as the first and second contact patterns 42 and 44, respectively, and the first and second source/drain electrodes 52 and 54 may be formed on the first and second contact patterns 42 and 44, respectively.

The manufacturing of the semiconductor device may be completed by the processes illustrated with reference to FIGS. 6 and 1.

While non-limiting embodiments have been particularly shown and described, it will be understood by one of ordinary skill in the art that variations in form and detail may be made therein without departing from the spirit and scope of the present disclosure.

What is claimed is:

1. A semiconductor device, comprising:
a channel on a substrate, the channel including a 2-dimensional material;
a gate insulating layer on a first portion of the channel;
a gate electrode on a portion of the gate insulating layer;
first and second contact patterns on second portions of the channel, respectively, each of the first and second contact patterns including a 2-dimensional material having an intercalation material disposed therein; and
first and second source/drain electrodes on the first and second contact patterns, respectively, each of the first and second source/drain electrodes including a metal,
wherein the gate insulating layer covers a lower surface and a sidewall of the gate electrode.

2. The semiconductor device of claim 1, wherein each of the first and second contact patterns includes a transition metal dichalcogenide (TMD) containing a transition metal and a chalcogen element.

3. The semiconductor device of claim 2, wherein the transition metal includes at least one element selected from molybdenum (Mo), tungsten (W), rhenium (Re), niobium (Nb), vanadium (V), tantalum (Ta), titanium (Ti), zirconium (Zr) hafnium (Hf) and technetium (Tc).

4. The semiconductor device of claim 2, wherein the chalcogen element includes at least one element selected from sulfur(S), selenium (Se), and tellurium (Te).

5. The semiconductor device of claim 2, wherein the transition metal dichalcogenide (TMD) includes molybdenum sulfide ($MoS_2$).

6. The semiconductor device of claim 1, wherein each of the first and second contact patterns has a multi-layered structure including a plurality of single layers stacked in a vertical direction substantially perpendicular to an upper surface of the substrate, each of the single layers including a 2-dimensional material and the intercalation material is disposed between the single layers.

7. The semiconductor device of claim 6, wherein the intercalation material includes lithium (Li).

8. The semiconductor device of claim 1, wherein the channel and the first and second contact patterns include a substantially same 2-dimensional material.

9. The semiconductor device of claim 1, further comprising:
a first contact plug on the gate electrode; and
second and third contact plugs on the first and second source/drain electrodes, respectively.

10. The semiconductor device of claim 1, wherein the gate insulating layer covers a sidewall of each of the first and second contact patterns, and a sidewall and an upper surface of each of the first and second source/drain electrodes.

11. The semiconductor device of claim 1, further comprising an insulating layer positioned between the substrate and the channel.

12. A semiconductor device, comprising:
a channel on a substrate, the channel including a transition metal dichalcogenide (TMD) containing a transition metal and a chalcogen element;
a gate insulating layer on a first portion of the channel;
a gate electrode on a first portion of the gate insulating layer;
first and second contact patterns on second portions of the channel, respectively; and
first and second source/drain electrodes on the first and second contact patterns, respectively, each of the first and second source/drain electrodes includes a metal,
wherein each of the first and second contact patterns has a multi-layered structure including single layers stacked in a vertical direction substantially perpendicular to an upper surface of the substrate, each of the single layers including a transition metal dichalcogenide (TMD), and an intercalation material disposed between the single layers.

13. The semiconductor device of claim 12, wherein the transition metal includes at least one element selected from molybdenum (Mo), tungsten (W), rhenium (Re), niobium (Nb), vanadium (V), tantalum (Ta), titanium (Ti), zirconium (Zr) hafnium (Hf) and technetium (Tc).

14. The semiconductor device of claim 12, wherein the chalcogen element includes at least one element selected from sulfur(S), selenium (Se), and tellurium (Te).

15. The semiconductor device of claim 12, wherein the transition metal dichalcogenide (TMD) includes molybdenum sulfide ($MoS_2$).

16. The semiconductor device of claim 12, wherein the intercalation material includes lithium (Li).

17. The semiconductor device of claim 15, wherein the channel and the first and second contact patterns include a substantially same 2-dimensional material.

18. The semiconductor device of claim 12, further comprising:
   second and third contact plugs contacting upper surfaces of the first and second source/drain electrodes, respectively, and including a metal.

19. A semiconductor device, comprising:
   an insulating layer on a substrate;
   a channel on the insulating layer, the channel including a 2-dimensional material;
   first and second contact patterns on upper edge surfaces, respectively, of the channel, each of the first and second contact patterns including a 2-dimensional material having an intercalation material disposed therein;
   first and second source/drain electrodes on the first and second contact patterns, respectively, each of the first and second source/drain electrodes including a metal;
   a gate insulating layer on an upper central surface and sidewalls of the channel, sidewalls of the first and second contact patterns, and sidewalls and upper surfaces of the first and second source/drain electrodes;
   a gate electrode on the gate insulating layer on the upper central surface of the channel, wherein a lower surface and a sidewall of the gate electrode are covered by the gate insulating layer;
   a first contact plug directly contacting an upper surface of the gate electrode; and
   second and third contact plugs extending through the gate insulating layer and directly contacting upper surfaces of the first and second source/drain electrodes, respectively.

* * * * *